(12) United States Patent
Ivanov et al.

(10) Patent No.: US 11,962,276 B2
(45) Date of Patent: Apr. 16, 2024

(54) INPUT CURRENT TRIM FOR CHOPPER OPERATIONAL AMPLIFIER

(71) Applicant: TEXAS INSTRUMENTS INCORPORATED, Dallas, TX (US)

(72) Inventors: Vadim Valerievich Ivanov, Tucson, AZ (US); Srinivas Kumar Pulijala, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/501,210

(22) Filed: Oct. 14, 2021

(65) Prior Publication Data
US 2023/0118397 A1    Apr. 20, 2023

(51) Int. Cl.
*H03F 1/02* (2006.01)
*H03F 3/393* (2006.01)
*H03F 3/45* (2006.01)

(52) U.S. Cl.
CPC ......... *H03F 3/393* (2013.01); *H03F 3/45179* (2013.01); *H03F 2200/165* (2013.01); *H03F 2200/261* (2013.01); *H03F 2200/271* (2013.01)

(58) Field of Classification Search
CPC ................ H03F 3/393; H03F 3/45179; H03F 2200/165; H03F 2200/261; H03F 2200/271; H03F 3/45475; H03F 1/303; H03F 3/005; H03F 1/02
USPC .......................................................... 330/9
See application file for complete search history.

(56) References Cited

U.S. PATENT DOCUMENTS

| | | | |
|---|---|---|---|
| 7,518,440 B1 * | 4/2009 | Trifonov | H03F 3/45475 327/124 |
| 7,586,368 B2 * | 9/2009 | Trifonov | H03F 3/393 327/124 |
| 8,072,262 B1 | 12/2011 | Burt et al. | |
| 9,246,484 B2 * | 1/2016 | Kusuda | H03K 17/162 |
| 10,673,389 B2 * | 6/2020 | Sloboda | H03F 1/26 |
| 2015/0288336 A1 | 10/2015 | Kusuda | |
| 2016/0006403 A1 | 1/2016 | Ivanov et al. | |

OTHER PUBLICATIONS

"A 60 V Auto-Zero and Chopper Operational Amplifier With 800 kHz Interleaved Clocks and Input Bias Current Trimming"; Yoshinori Kusuda, Member, IEEE; IEEE Journal of Solid-State Circuits, vol. 50, No. 12, Dec. 2015; pp. 2804-2813.

* cited by examiner

*Primary Examiner* — Khanh V Nguyen
(74) *Attorney, Agent, or Firm* — Valerie M. Davis; Frank D. Cimino

(57) ABSTRACT

In examples of a chopper operational amplifier, a current control circuit comprises a pair of voltage sources, each of which may be varied to generate a voltage signal of a particular value, and multiple inverters, each of which is configured to receive either a clock signal or its complement signal and one of the voltage signals. Based on these inputs, each inverter generates a control signal that is delivered to a corresponding switch in the input stage of the chopper operational amplifier to control the gate voltage of that switch. Based on the difference between the values of the voltage signals, the current control circuit operates to reduce the amplitudes of base currents induced by charge injection at the input terminals of the chopper operational amplifier.

19 Claims, 3 Drawing Sheets

INPUT CURRENT TRIM FOR CHOPPER OPERATIONAL AMPLIFIER

FIELD OF DISCLOSURE

This disclosure relates generally to chopper-stabilized operational amplifiers, and more particularly to associated structures and methods for trimming input current in such amplifiers.

BACKGROUND

Chopper-stabilized operational amplifiers (chopper op amps) are used in a variety of industrial and instrumentation applications, especially in applications in which low operating power is a requirement. Chopper op amps provide excellent offset voltage and offset drift performance. Chopper op amps also have excellent power supply rejection ratio (PSRR) and common mode rejection ratio (CMRR).

The main drawback affecting chopper op amp accuracy is the input bias current associated with the chopper circuitry. The input bias current of CMOS chopper op amps is significantly larger than that in CMOS standard op amps because of charge injection and clock feed-through induced from input chopping switches. The charge injection that occurs at the input chopping switches of a chopper op amp results in a DC current component, i.e., a DC current offset, of the chopper op amp.

The input stage of a chopper op amp is coupled to two input terminals through a set of switches to which a differential input signal is applied. Operation of these switches results in injected charge flowing into or out of each of the two input terminals at a rate proportional to the chopping frequency. Mismatches in the size and/or parasitic capacitance of the switches cause the amount of charge flowing at one clock phase transition to be different than that flowing at another clock phase transition. That difference, integrated over time, e.g., over any chopping period, which is the net amount of injected charge flowing into or out of the two input terminals, is DC current or DC offset current. Thus, relatively small spikes of current may flow into or out of the positive and negative input terminals. If corresponding positive and negative current spikes do not match, there is a recurring net current spike, which is integrated over time. This results in input bias current, which is a DC current.

While various ways have been proposed for controlling the input bias current, some introduce complications to circuit operation and/or require additional components, e.g., capacitors, logic gates, thus increasing the size of the chopper op amp.

A simple, efficient solution to the input bias current issue in chopper op amps is thus desirable.

SUMMARY

In accordance with an example, a current control circuit comprises first and second voltage sources, each having first and second voltage terminals, the first terminal of each of the first and second voltage sources coupled to a voltage supply (e.g., ground); and a plurality of inverters, each having a first voltage terminal coupled to the voltage supply. A first inverter (e.g., I1) of the plurality of inverters has a clock input configured to receive a first clock signal (e.g., CLK), a second voltage terminal coupled to the second voltage terminal of the first voltage source (e.g., to receive output V1), and an output configured to generate a first control signal. A second inverter (e.g., I4) of the plurality of inverters has clock input configured to receive a second clock signal (e.g., CLKZ), a second voltage terminal coupled to the second voltage terminal of the second voltage source (e.g., to receive output V0), and an output configured to generate a second control signal.

In accordance with an example, a chopper operational amplifier comprises a filter section (e.g., 104); a switch section (e.g., 106) coupled to the filter section; a capacitance section (e.g., C1-C4) coupled to the switch section; and a current control circuit (e.g., 108) coupled to the capacitance section. The filter section includes first and second input terminals, and the switch section includes a plurality of switches. The current control circuit includes first and second voltage sources, the first voltage source configured to be varied to generate a first voltage signal and the second voltage source configured to be varied to generate a second voltage signal.

In accordance with an example, a method comprises applying a differential input voltage signal to input terminals of a chopper operational amplifier, generating base currents at the input terminals; applying a clock signal and a complement clock signal to a current control section of the chopper operational amplifier; applying first and second control voltage signals to the current control section; and adjusting the first and second control voltage signals to control the amplitudes of the base currents.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
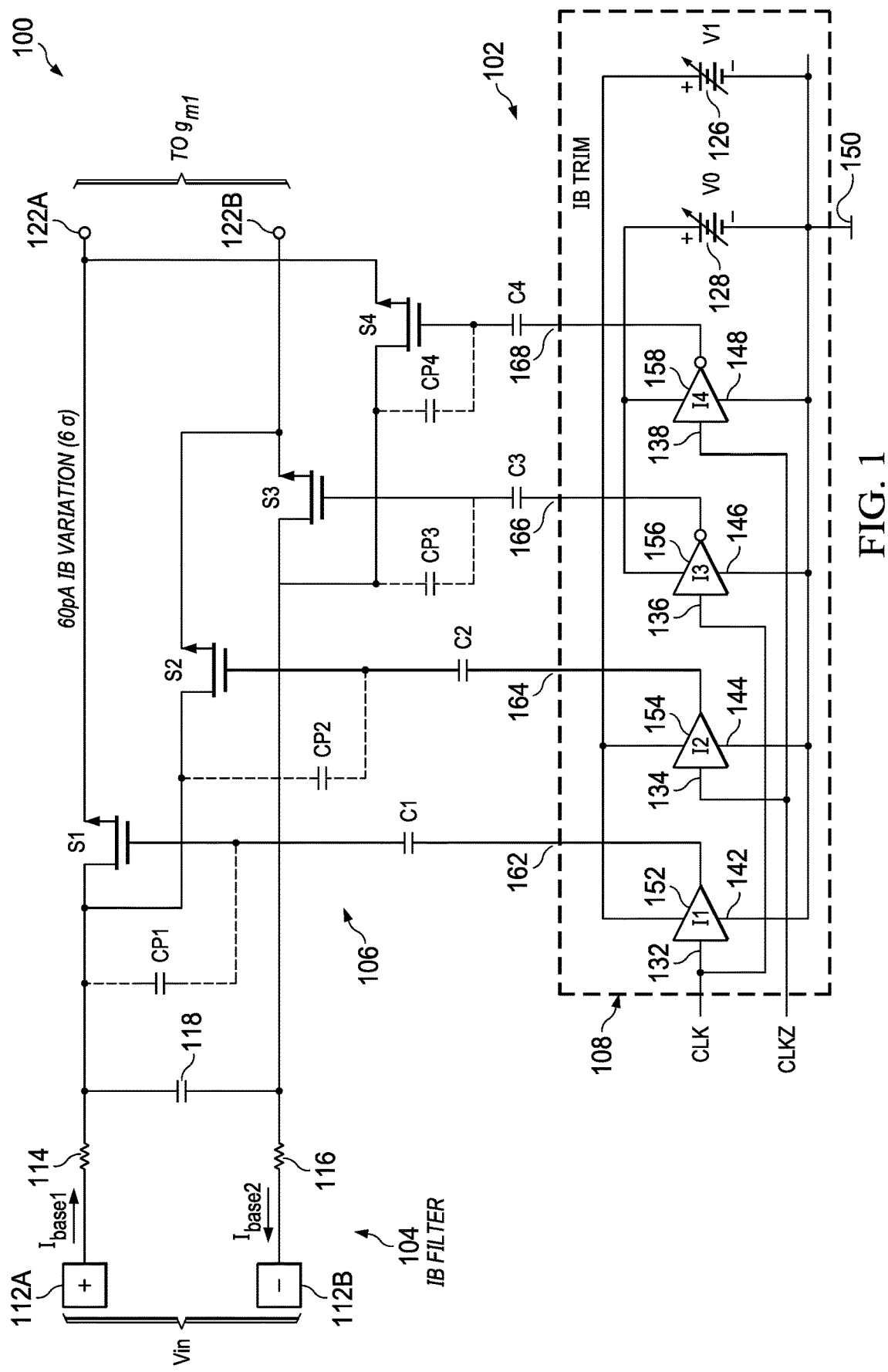
FIG. 1 is a circuit diagram of an example of an input stage of a chopper operational amplifier (chopper op amp).

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale. Also, the term "coupled" and derivatives thereof, as used herein, include direct connection or coupling between two elements, indirect connection or coupling through one or more intervening elements, as well as contactless or wireless communication.

In example arrangements, a current control circuit configured to output voltage signals to respective switches of the input stage of a chopper operational amplifier (chopper op amp) substantially reduces the base currents, which are DC currents, flowing at the input terminals of the input stage. In an example, the current control circuit includes four (4) control elements, one associated with each of four (4) transistor switches, and two (2) variable voltage sources, one of which delivers a voltage signal (V1) and the other of which delivers a voltage signal (V0). The value of each of V1 and V0 may be set via the corresponding variable voltage source. Each of the control elements is responsive to a unique combination of a clock signal and a voltage signal to output a control signal to its corresponding switch. In an example, a level shifting capacitor is disposed between each control element and its associated switch. In an example, each of the control elements is implemented as an inverter. In an example, the current control circuit is implemented as a level shifter. The difference between V0 and V1 is controlled to reduce the base currents. By using different power supplies, e.g., tunable or variable supply voltages which drive the control terminals, e.g., gates, of the transistor switches, of different clock phases through level shifting capacitors, the base currents can be significantly reduced, thus providing the chopper op amp with better accuracy.

FIG. 1 is a circuit diagram of an input stage 102 of a chopper op amp 100. Input stage 102 may include a filter section 104, a switch section 106, and an input base current (IB) trim section 108. Input stage 102 includes a pair of input terminals 112A and 112B, one of which is positive (+) and the other negative (−), to which an input signal (Vin) is applied. Filter section 104 may include, or be implemented as, a differential filter that includes a pair of input resistors 114 and 116. A first terminal of input resistor 114 is coupled to positive (+) input terminal 112A, and a first terminal of input resistor 116 is coupled to negative (−) input terminal 112B. A capacitor 118 is coupled between the second terminals of input resistors 114 and 116. Switch section 106 may include a plurality of switches, which may be implemented by a plurality of transistors, each of which may be a metal-oxide-silicon field-effect transistor (MOSFET). Input base current (IB) trim section 108 functions as a current control circuit.

In an example, the plurality of switches includes a first switch S1, a second switch S2, a third switch S3 and a fourth switch S4. In an example, each of switches S1, S2, S3 and S4 may be a p-type MOSFET. Each switch has a gate-drain parasitic capacitance shown in dashed lines in FIG. 1. Switches S1, S2, S3, and S4 have gate-drain parasitic capacitances Cp1, Cp2, Cp3 and Cp4, respectively.

The gates of switches S1, S2, S3 and S4 are coupled to capacitors C1, C2, C3 and C4, respectively. These capacitors, which may be sized based on design and/or operating parameters, may be considered a capacitance section of input stage 102.

The drain of switch S1 is coupled to the second terminal of input resistor 114, and the source of switch S1 is coupled to a first output 122A of input stage 102. The drain of switch S3 is coupled to the second terminal of input resistor 116, and the source of switch S1 is coupled to a second output 122B of input stage 102. Switch S2 is coupled between the drain of switch S1 and the source of S3, with the drain of switch S2 coupled to the drain of switch S1 and the source of switch S2 coupled to the source of switch S3. Switch S4 is similarly coupled between terminals of switches S1 and S3. That is, the drain of switch S4 is coupled to the drain of switch S3, and the source of switch S4 is coupled to source of switch S1.

Operation of switches S1-S4, which form chopper circuitry of chopper op amp 100, generate DC currents, as explained above. The DC current flowing between input terminal 112A and corresponding output terminal 122A is denoted $I_{base1}$, and the DC current flowing between input terminal 112B and corresponding output terminal 122B is denoted $I_{base2}$.

Input base current (IB) trim section (i.e., current control circuit) 108 is configured to trim, i.e., reduce, $I_{base1}$ and $I_{base2}$. In an example, current control circuit 108 is configured as a level shifter using a plurality of inverters, e.g., four (4) inverters I1-I4. Each of these inverters may be considered a control element. Current control circuit 108 also includes a pair of tunable (i.e., variable) voltage sources 126 and 128, which generate first and second voltage signals V1 and V0, respectively. V1 and V0 may be digitally controlled by, for example, a digital-to-analog controller (DAC) (not shown), which is coupled to variable voltage sources 126 and 128, each of which may function as a low-dropout (LDO) regulator.

Inverters I1-I4 have clock inputs 132, 134, 136 and 138, respectively, to receive a clock signal. Inverters I1 and I3 each receive a first clock signal (CLK), while inverters I2 and I4 each receive a second clock signal (CLKZ), which may be the complement of CLK. Each inverter I1-I4 has two voltage supply terminals. Voltage supply terminals 142, 144, 146 and 148 of inverters I1-I4, respectively, are commonly coupled to a supply voltage 150, which may be ground or a negative supply voltage. One terminal, e.g., negative (−) terminal, of each of variable voltage source 126 and 128 is also coupled to supply voltage 150.

The other voltage supply terminal of each of inverter I1 and I2, identified as 152 and 154, respectively, is coupled to the other terminal, e.g., positive (+) terminal, of variable voltage source 126, where V1 is generated. The other voltage supply terminal of each of inverter I3 and I4, identified as 156 and 158, respectively, is coupled to the other terminal, e.g., positive (+) terminal, of variable voltage source 128, where V0 is generated.

Current control circuit 108 has multiple outputs, one corresponding to each inverter. Inverter I1 has an output 162 coupled to capacitor C1, inverter I2 has an output 164 coupled to capacitor C2, inverter I3 has an output 166 coupled to capacitor C3, and inverter I4 has an output 168 coupled to capacitor C4.

Thus, each inverter I1-I4 receives a unique combination of a particular clock signal (CLK or CLKZ) and a particular voltage signal (V1 or V0) to collectively control switches S1-S4. Inverter I1 receives CLK and V1, inverter I2 receives CLKZ and V1, inverter I3 receives CLK and V0, and inverter I4 receives CLKZ and V0. In response to CLK and V1, inverter I1 outputs a first control signal to control the voltage across capacitor C1, and hence to control the gate drive voltage of switch S1 and also to control the current through its gate-drain parasitic capacitance Cp1. In response to CLKZ and V1, inverter I2 outputs a second control signal to control the voltage across capacitor C2, and hence to control the gate drive voltage of switch S2 and also to control the current through its gate-drain parasitic capacitance Cp2. In response to CLK and V0, inverter I3 outputs a third control signal to control the voltage across capacitor C3, and hence to control the gate drive voltage of switch S3 and also to control the current through its gate-drain parasitic capacitance Cp3. In response to CLKZ and V0, inverter I4 outputs a fourth control signal to control the voltage across capacitor C4, and hence to control the gate drive voltage of switch S4 and also to control the current through its gate-drain parasitic capacitance Cp4. By so controlling the gate drive voltages of switches S1-S4, and thus controlling current through their gate-drain parasitic capacitances, the amplitudes of $I_{base1}$ and $I_{base2}$ are controlled, i.e., reduced.

Figure 2:
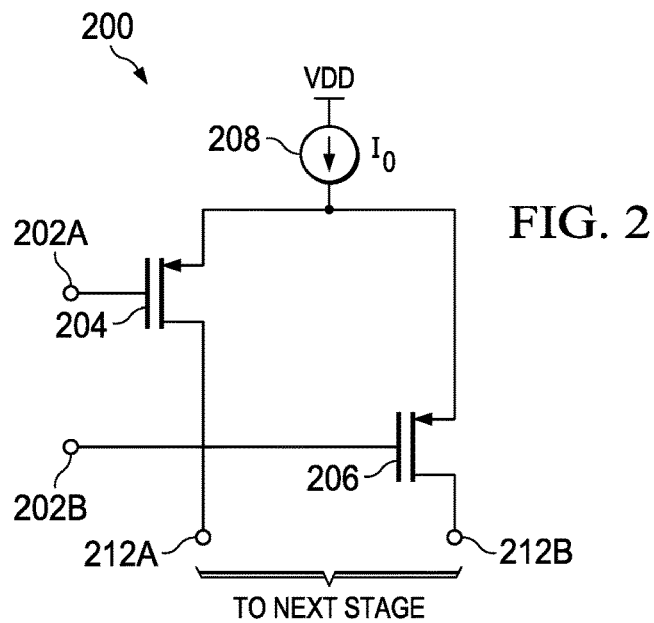
FIG. 2 is a circuit diagram of an example transconductance stage of a chopper op amp.

FIG. 2 is a circuit diagram of an example transconductance ($g_{m1}$) stage 200 of chopper op amp 100. Inputs 202A and 202B are coupled to outputs 122A and 122B, respectively, of input stage 100. Input 202A extends as a lead to the gate of n-type MOSFET 204, and input 202B extends as a lead to the gate of n-type MOSFET 206. The sources of transistors 204 and 206 are coupled to a current source 208 that delivers a current $I_0$. Current source 208 is driven by a voltage supply VDD. The drains of transistors 204 and 206 form output terminals 212A and 212B, respectively, of transconductance stage 200. Output terminals 212A and 212B may be coupled to a next stage of chopper op amp 100. Other or alternative components may be included in transconductance stage 200, as is known in the art.

Figure 3:
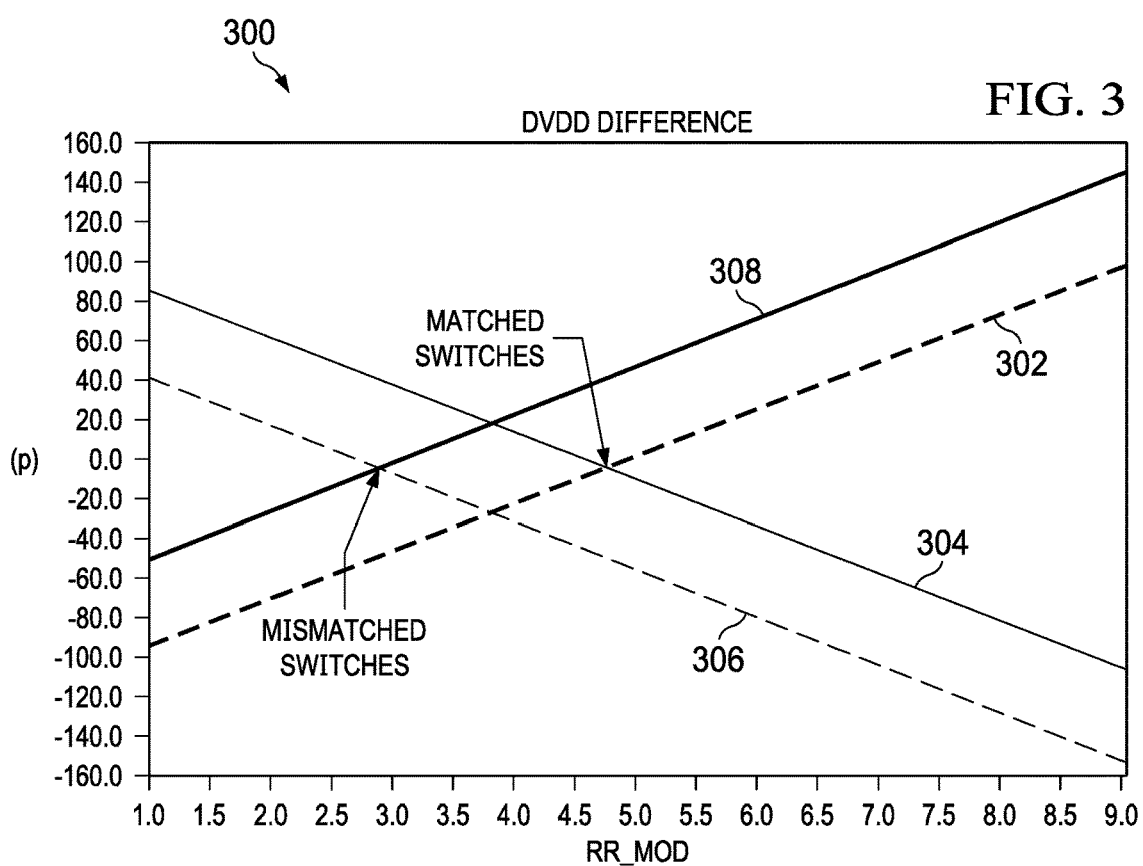
FIG. 3 is a graph showing base current variation with respect to the difference between voltage signals V0 and V1.

FIG. 3 is a graph 300 showing base current variation in picoamperes (p) with respect to the difference between the voltage signals V0 and V1, which is given in terms of the trim code (RR_MOD), in which RR MOD code 1.0 represents binary 000, RR MOD code 2.0 represents binary 001, . . . , and RR MOD code 8.0 represents binary 111. The trim code may be implemented in any suitable way, e.g., in sign magnitude form, 2's complement, etc. Data are shown for both matched and unmatched switches. The trim code may be set by a DAC. Lines 302 and 304 represent base current variations for the matched switch configuration, and lines 306 and 308 represent base current variations for the unmatched switch configuration. In each configuration, base current variations can be substantially reduced, i.e., to approximately to zero, by controlling V0 and V1.

In exemplary matched switches, the base currents can be reduced to approximately zero with a trim code of approximately 5, which corresponds to a V1-V0 difference of approximately zero mV. For example, to attain that difference, V1 may be set at 1700 mV, and V0 may be set at 1700 mV. In exemplary unmatched switches, the base currents can be reduced to approximately zero with a trim code of approximately 3, which corresponds to a V1-V0 difference of 50 mV. For example, to attain that difference, V1 may be set at 1700 mV, and V0 may be set at 1650 mV. In most cases, a 100 mV difference between V1 and V0 is sufficient for a 100 pA trim range.

Figure 4:
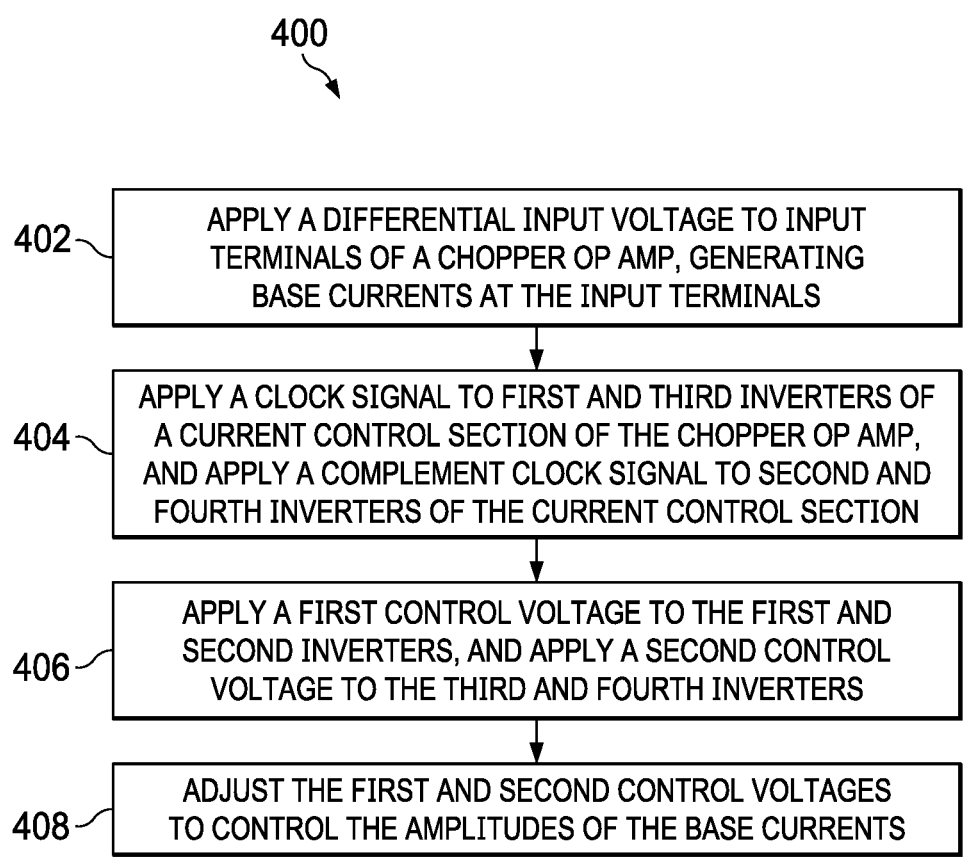
FIG. 4 is a flow diagram of an example method of trimming base currents of a chopper op amp.

FIG. 4 is a flow diagram of an example method 400 of trimming the base currents of a chopper op amp, e.g., chopper op amp 100. In operation, a differential input voltage signal is applied to input terminals of a chopper operational amplifier, which results in base currents at the input terminals (operation 402). To trim the base currents, a clock signal (e.g., CLK) and a complement clock signal (e.g., CLKZ) are applied to a current control section of the chopper op amp, which section may comprise four (4) inverters, e.g., inverters I1-I4. More specifically, CLK may be applied to the first and third inverters (e.g., I1 and I3), and CLKZ may be applied to the second and fourth inverters (e.g., I2 and I4) in operation 404. First and second control voltage signals (e.g., V1 and V0) may also be applied to the current control section. In an example of such application of the control voltage signals, in operation 406, V1 may be applied to the first and second inverters (e.g., I1 and I2), and V0 may be applied to the third and fourth inverters (e.g., I3 and I4). In operation 408, the first and second control voltage signals are adjusted to control the amplitudes of the base currents.

The first and second control voltage signals are adjusted to adjust current through parasitic capacitances (e.g., Cp1-Cp4) of switches (e.g., S1-S4) coupled to the input terminals.

Method 400 may further comprise outputting a first control signal from the first inverter (e.g., I1) of the current control section, in response to the clock signal and the first control voltage signal being input to the first inverter; outputting a second control signal from the second inverter (e.g., I2) of the current control section, in response to the complement clock signal and the first control voltage signal being input to the second inverter; outputting a third control signal from the third inverter (e.g., I3) of the current control section, in response to the clock signal and the second control voltage signal being input to the third inverter; and outputting a fourth control signal from the fourth inverter (e.g., I4) of the current control section, in response to the complement clock signal and the second control voltage signal being input to the fourth inverter.

Method 400 may further comprise controlling the first switch (e.g., S1) coupled to an output of the first inverter based on the first control signal; controlling the second switch (e.g., S2) coupled to an output of the second inverter based on the second control signal; controlling the third switch (e.g., S3) coupled to an output of the third inverter based on the third control signal; and controlling the fourth switch (e.g., S4) coupled to an output of the fourth inverter based on the fourth control signal.

FIG. 4 depicts one possible order of operations in trimming the input base current of a chopper op amp. Not all operations need necessarily be performed in the order described. Some operations may be combined into a single operation. Alternative operations consistent with the teachings herein may be performed. Additional operations may be performed as well.

Various examples of chopper op amps and input stages thereof configured to substantially reduce input stage base currents are disclosed and claimed. In an example, an input stage of a chopper op amp is configured to include a current control circuit that functions to reduce the amplitudes of the base currents induced by charge injection at the input terminals of the chopper op amp by adjusting the currents through the gate-drain parasitic capacitances of MOS transistor switches of the input stage. The current control circuit includes two (2) variable voltage sources, each of which may be tuned to generate a particular voltage signal. The variable voltage sources are controlled to generate a particular difference between the two voltage signals, each of which may be varied. One of the two voltage signals, along with one of two clock signals, is input to each of multiple control elements to generate respective control signals. A respective one of those control signals is delivered to the gate of each MOS transistor to control its gate drive. A chopper op amp implemented with a current control circuit, according to the teachings herein, may be effective in substantially reducing base currents to approximately zero for input stages with matched switch transistors and for input stages with unmatched switch transistors.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal" and "lead" may be a node, interconnection and/or pin, which are considered interchangeable. Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type MOSFET may be used in place of an n-type MOSFET, and vice versa, with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a signal ground, a digital ground, a common ground, and/or any other form of ground connection applicable to, or suitable for, the teachings of this description. Unless otherwise stated, "about," "approximately," or "substantially" preceding a value means+/-10 percent of the stated value. Also, the identifiers such as a "first", "second", "third", etc. are simply used to distinguish among elements with the same or substantially the same name, and use of these identifiers in the claims may not correspond to their use in the specification.

Modifications of the described examples are possible, as are other examples, within the scope of the claims. Moreover, features described herein may be applied in other environments and applications consist with the teachings provided.

What is claimed is:

1. A current control circuit comprising:
   a first voltage source having first and second terminals;
   a second voltage source having first and second terminals, the first terminals of the first and second voltage sources coupled together;
   a first inverter having a clock input in which to receive a first clock signal, having a first terminal coupled to the first terminals of the first and second voltage sources, having a second terminal coupled to the second terminal of the first voltage source, and having an output from which to provide a first control signal; and
   a second inverter having a clock input in which to receive a second clock signal, having a first terminal coupled to the first terminals of the first and second voltage sources, having a second terminal coupled to the second terminal of the second voltage source, and having an output from which to provide a second control signal.

2. The current control circuit of claim 1, further comprising:
   a third inverter having a clock input in which to receive the second clock signal, having a first terminal coupled to the first terminals of the first and second voltage sources, having a second terminal coupled to the second terminal of the first voltage source, and having an output from which to provide a third control signal.

3. The current control circuit of claim 2, further comprising:
   a fourth inverter having a clock input in which to receive the first clock signal, having a first terminal coupled to the first terminals of the first and second voltage sources, having a second terminal coupled to the second terminal of the second voltage source, and having an output from which to provide a fourth control signal.

4. A chopper operational amplifier, comprising:
   a filter circuit including first and second input terminals;
   a switch circuit coupled the filter circuit, the switch circuit including a plurality of switches;
   a capacitance circuit coupled to the switch circuit; and
   a current control circuit coupled to the capacitance circuit, the current control circuit including first and second voltage sources, the first voltage source configured to generate a first voltage signal, and the second voltage source configured to generate a second voltage signal, and wherein the current control circuit is configured to change the amplitudes of first and second base currents through the first and second input terminals, respectively, based on values of the first and second voltage signals.

5. The chopper operational amplifier of claim 4, wherein the current control circuit is configured to change the amplitudes of first and second base currents through the first and second input terminals, respectively, based on a difference between the values of the first and second voltage signals.

6. The chopper operational amplifier of claim 4, wherein the switch circuit includes a plurality of transistors and the capacitance circuit includes a plurality of capacitors respectively coupled to the plurality of transistors.

7. The chopper operational amplifier of claim 6, wherein the current control circuit includes a plurality of control elements respectively coupled to the plurality of capacitors.

8. The chopper operational amplifier of claim 7, wherein each of the plurality of control elements has a first terminal that is coupled to a common voltage supply.

9. The chopper operational amplifier of claim 8, wherein a first control element of the plurality of control elements is configured to receive a first clock signal and has a second terminal coupled to the first voltage source to receive the first voltage signal.

10. The chopper operational amplifier of claim 9, wherein a second control element of the plurality of control elements is configured to receive a second clock signal and has a second terminal coupled to the first voltage source to receive the first voltage signal.

11. The chopper operational amplifier of claim 10, wherein a third control element of the plurality of control elements is configured to receive the first clock signal and has a second terminal coupled to the second voltage source to receive the second voltage signal.

12. The chopper operational amplifier of claim 11, wherein a fourth control element of the plurality of control elements is configured to receive the second clock signal and has a second terminal coupled to the second voltage source to receive the second voltage signal.

13. The chopper operational amplifier of claim 7, wherein the plurality of control elements includes a plurality of inverters.

14. A method comprising:
   applying a differential input voltage signal to input terminals of a chopper operational amplifier, and generating base currents at the input terminals;
   applying a clock signal and a complement clock signal to a current control circuit of the chopper operational amplifier;
   applying first and second control voltage signals to the current control circuit; and
   adjusting the first and second control voltage signals to control the amplitudes of the base currents.

15. The method of claim 14, wherein the first and second control voltage signals are adjusted to adjust current through parasitic capacitances of switches coupled to the input terminals.

16. The method of claim 14, wherein the applying of the clock signal and the complement clock signal includes applying the clock signal to first and third inverters of the current control circuit, and applying the complement clock signal to second and fourth inverters of the current control circuit.

17. The method of claim 14, wherein the applying of the first and second control voltage signals includes applying the first control voltage signal to the first and second inverters, and applying the second control voltage signal to the third and fourth inverters.

18. The method of claim 14, further comprising:
   outputting a first control signal from a first inverter of the current control circuit, in response to the clock signal and the first control voltage signal input to the first inverter;
   outputting a second control signal from a second inverter of the current control circuit, in response to the complement clock signal and the first control voltage signal input to the second inverter;
   outputting a third control signal from a third inverter of the current control circuit, in response to the clock signal and the second control voltage signal input to the third inverter; and
   outputting a fourth control signal from a fourth inverter of the current control circuit, in response to the complement clocks signal and the second control voltage signal input to the fourth inverter.

19. The method of claim 18, further comprising:
   controlling a first switch coupled to an output of the first inverter based on the first control signal;
   controlling a second switch coupled to an output of the second inverter based on the second control signal;
   controlling a third switch coupled to an output of the third inverter based on the third control signal; and
   controlling a fourth switch coupled to an output of the fourth inverter based on the fourth control signal.

* * * * *